(12) United States Patent
Martin et al.

(10) Patent No.: US 6,290,868 B1
(45) Date of Patent: Sep. 18, 2001

(54) FIELD-STRUCTURED MATERIAL MEDIA AND METHODS FOR SYNTHESIS THEREOF

(75) Inventors: James E. Martin, Tijeras; Robert C. Hughes; Robert A. Anderson, both of Albuquerque, all of NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 09/322,068

(22) Filed: May 27, 1999

(51) Int. Cl.[7] .......................... H01R 1/113; H01R 1/114; H01R 1/37; H01R 1/375
(52) U.S. Cl. ...................... 252/62.54; 252/62.53; 252/62.55; 252/62.51 R; 264/108; 264/437; 264/429; 264/440; 428/611; 428/900; 428/928
(58) Field of Search .................. 252/62.51 R, 62.55, 252/62.54, 62.53; 148/108; 264/108, 437, 429, 440; 428/611, 928, 900

(56) References Cited

U.S. PATENT DOCUMENTS

| | | | | |
|---|---|---|---|---|
| 2,848,748 | * | 8/1958 | Crump | 264/108 |
| 4,900,497 | * | 2/1990 | Lodini | 264/104 |
| 5,045,249 | * | 9/1991 | Jin et al. | 264/108 |
| 5,213,713 | * | 5/1993 | Reitz | 252/500 |
| 5,569,432 | * | 10/1996 | Maciejewski | 264/108 |
| 5,574,377 | | 11/1996 | Marquez-Lucero et al. | 324/533 |
| 5,954,991 | * | 9/1999 | Hong et al. | 252/62.52 |

* cited by examiner

*Primary Examiner*—C. Melissa Koslow
(74) *Attorney, Agent, or Firm*—Brian W. Dodson

(57) ABSTRACT

The present application is directed to a new class of composite materials, called field-structured composite (FSC) materials, which comprise a oriented aggregate structure made of magnetic particles suspended in a nonmagnetic medium, and to a new class of processes for their manufacture. FSC materials have much potential for application, including use in chemical, optical, environmental, and mechanical sensors.

28 Claims, 3 Drawing Sheets

FIELD-STRUCTURED MATERIAL MEDIA AND METHODS FOR SYNTHESIS THEREOF

Figure 1:
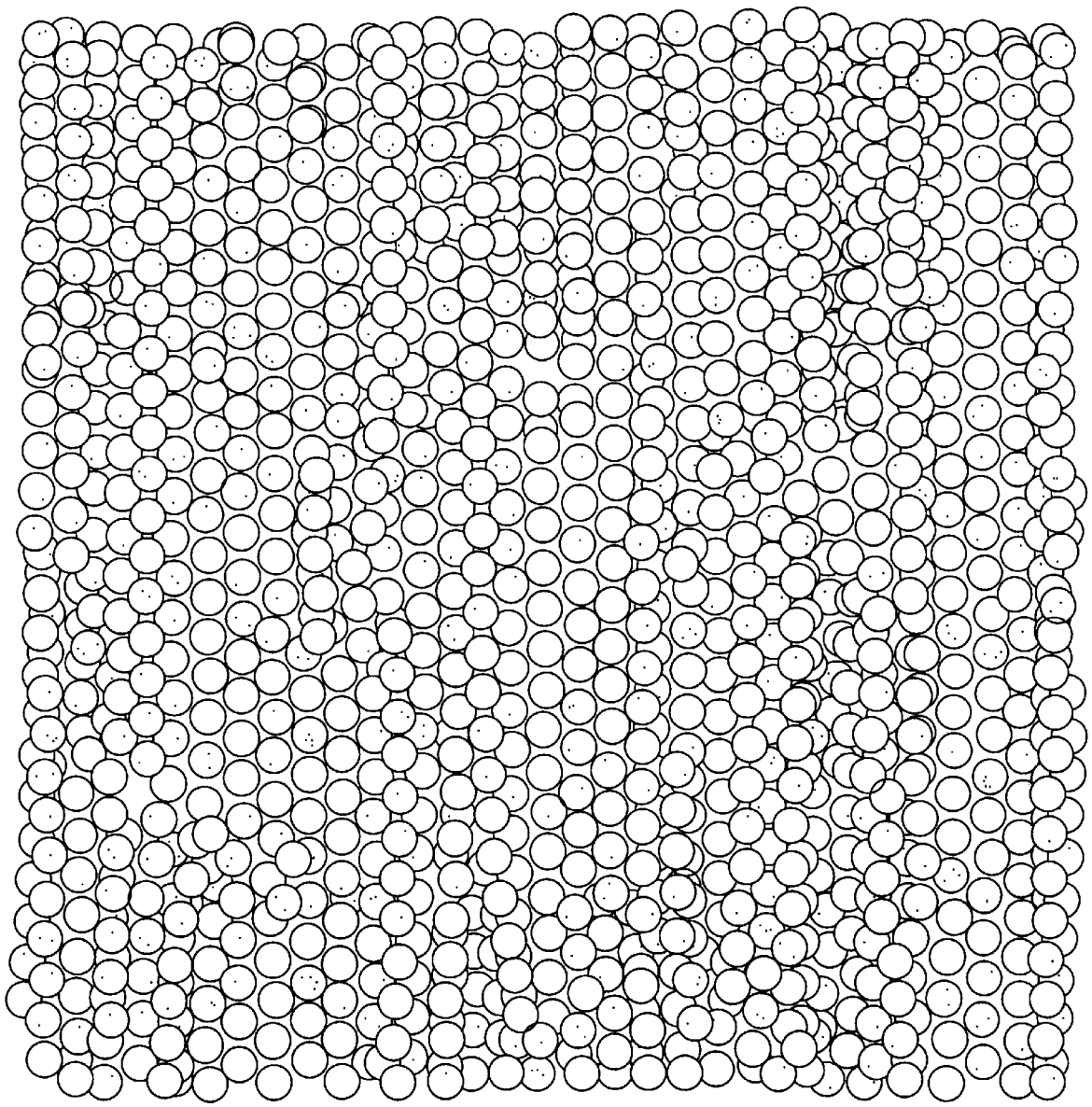

This invention was made with Government support under Contract DE-AC04-94DP85000 awarded by the U.S. Department of Energy. The Government has certain rights in the invention.

BACKGROUND

The present invention relates to a new class of materials possessing a substructure of oriented aggregates of suspended magnetic particles. This substructure self-assembles under the influence of an external magnetic field, and induces a wide range of mechanical, dielectric, magnetic, and optical properties. In a particularly useful subclass of these materials, the magnetic particles are electrically conducting or are coated with a conducting layer, and the columnar concentrations are just dense enough to form a continuously conducting path through the material. These new materials enable a broad range of sensor devices and other applications.

The conduction of electricity in materials comprising a particulate conducting phase dispersed in a nonconducting medium have been of scientific and practical interest for some time. Such materials as conductive inks, some forms of conducting polymers, and static elimination materials have long used such dispersions to provide conductivity to conventionally non-conducting elements.

Prior art primarily considers applications of a composite mixture of conducting particles essentially uniformly distributed in a nonconducting medium. Roughly speaking, one expects the conductivity of a composite mixture to increase as the volume fraction of the dispersed conducting phase increases (i.e., as more conductive particles are introduced into the mixture). This is true, but the bulk conductivity of the composite is not simply proportional to the volume fraction of the dispersed phase.

If the volume fraction of conducting particles is small, then on average each particle will be surrounded by a layer of the nonconducting medium, so that the individual particles do not touch each other. In this case, the total conductivity of the composite remains very small. Alternatively, if the volume fraction of conducting particles is large, then on average each conducting particle will make effective electrical contact with a sufficient number of neighboring particles that the bulk conductivity of the composite will be large.

There is a volume fraction, whose exact value depends on the shape and size distribution of the conducting particles, near which the bulk conductivity of the composite rapidly increases by many orders of magnitude. Below this critical volume fraction, conductive paths within the composite extend only short, microscopic distances, being interrupted by particles in poor electrical contact. The result is low bulk conductivity. Above this critical volume fraction, bulk electrical conduction is dominated by conducting particles which are essentially in direct physical contact, giving the composite high bulk conductivity.

Near the critical volume fraction for bulk conduction, there are many conducting paths that are only interrupted by a few instances where current conduction must go through particles which are nearly, but not quite in contact. Small changes in the particle volume fraction can complete many of the paths, making the conductivity of these materials very sensitive to such changes.

Applications exist for such essentially uniform composite materials. An example appears in U.S. Pat. 5,574,377, in which a chemical sensor is implemented by measuring the electrical resistance of a composite material formed of a gel-like polymer containing dispersed conducting particles with volume fraction near the critical volume fraction. The sensor material has large conductivity in the absence of external chemicals. However, the sensor material (more particularly the nonconducting polymer) swells when in the presence of certain organic solvents. Such swelling increases the gaps between particles, thereby driving a large reduction in the bulk conductivity of the sensor material. Such chemical sensors can be quite sensitive if the proper volume fraction is achieved in the sensor material.

Despite the clear potential for using such near-critical composite materials for a variety of functions, practical applications are limited by prior art fabrication technology. It is very difficult to disperse conducting particles uniformly in a nonconducting medium. Exceedingly small changes in process conditions, or simply random variations in the local volume fraction of the conducting particles, can reduce or destroy the desired material response.

Thus, near-critical composite materials made using conventional technology cannot be routinely applied to most applications unless a great deal of effort is taken to control and then characterize the composite. Numerous samples must be typically made under slightly varying conditions, and the samples then individually characterized in a search for individual pieces having the proper bulk properties. When such composites can be used, the device or mechanism thereby enabled usually requires individual calibration.

There is thus a longstanding need for composite materials comprising conducting particles which can be reliably manufactured to exhibit precise and predefined conducting properties.

SUMMARY

The present application is directed to a new class of composite materials, called field-structured composite (FSC) materials, comprising magnetic particles (generally electrically conducting), wherein the distribution of the magnetic particles within the composite is not uniform, but form oriented rod-like or sheet-like aggregations within the composite, and to a new class of processes for their manufacture.

In an implementation of one such process, a field-structured composite can be made beginning with a nominally uniform dispersion of magnetic particles in a fluid that can be solidified. This initial dispersion typically has a volume fraction well below the critical volume fraction for a uniform distribution. To form a uniaxial field-structured composite, an external magnetic field is applied to this initial dispersion. This magnetic field aligns the particles into thin rod-like aggregations of particles which form an interconnecting network within the fluid. This network of particles will conduct, even though the sample is beneath the critical volume fraction for a uniformly dispersed material.

As the network evolves in the magnetic field, the electrical conductivity of the composite along the direction of the applied magnetic field will progressively increase by many orders of magnitude. Likewise, the electrical conductivity perpendicular to the field progressively increases, but remains generally smaller. This is because the density of bridges that link rods in such a network is typically smaller than the density of rods.

The conductivity of the FSC can be brought to a desired target value by controlling the time the dispersion is subjected to the structuring magnetic field. When the desired conductivity has been attained, the fluid can be solidified (e.g., by freezing or polymerizing). By causing the material in which the particles are suspended to solidify when the measured properties of the composite conform to the targeted values, the rodlike aggregates of magnetic particles are fixed in position. The ability to tailor the properties of such materials makes them well suited to a wide range of applications.

BRIEF DESCRIPTION OF THE ILLUSTRATIONS

FIG. 1. A schematic diagram of a field-structured composite material whose aggregate structure evolved under the influence of a magnetic field whose relative orientation to the material was fixed. The result is a dense matrix of rodlike aggregates of conducting particles linked in the perpendicular direction by bridges between neighboring rods.

Figure 2:
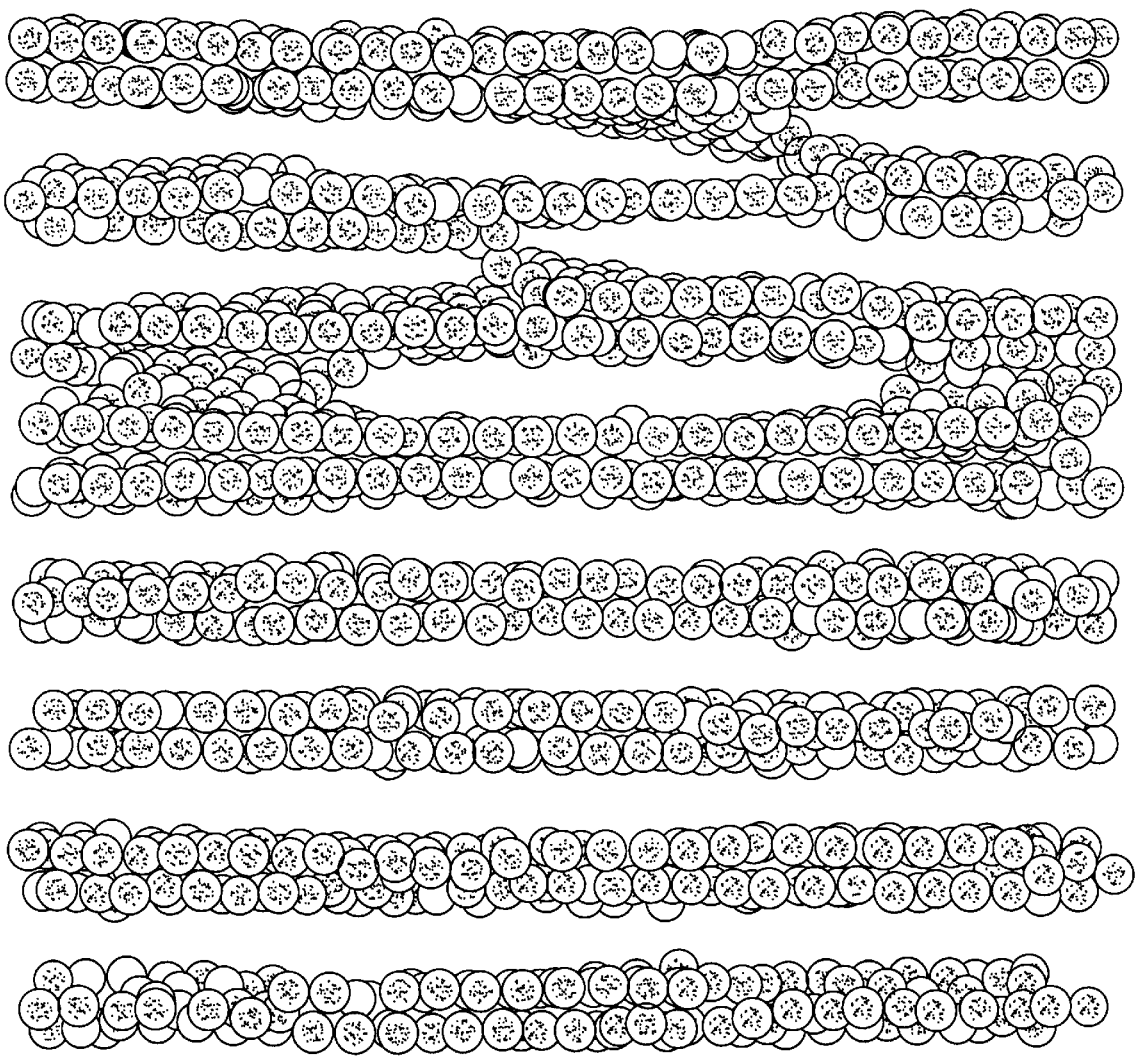

FIG. 2. A schematic diagram of a field-structured composite material whose aggregate structure evolved under the influence of a magnetic field whose relative orientation to the material was rotating in a plane. The result is a stack of thin sheet-like aggregates of conducting particles. These sheet-like aggregates are only rarely bridged together, resulting in strongly anisotropic bulk conductivity in the final composite.

Figure 3:
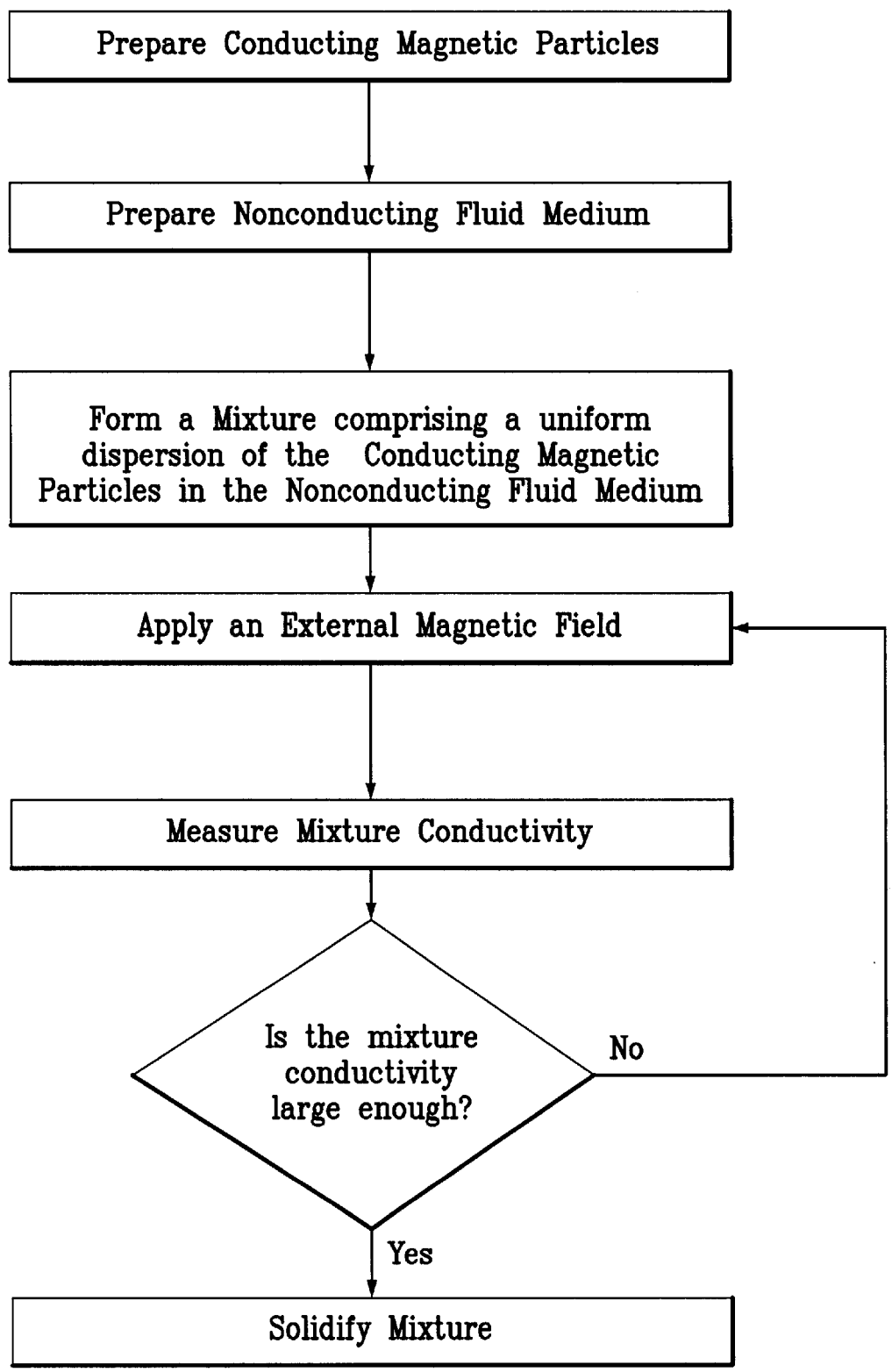

FIG. 3. A flow diagram of a process to prepare a solid field-structured composite material having a particular electrical conductivity perpendicular to the applied magnetic field. This process can produce field-structured composite materials with an arbitrary degree of percolation.

DETAILED DESCRIPTION

The present invention comprises a new class of structured composite materials called field-structured composite (FSC) materials. In one implementation, field-structured composite materials are produced by first forming a dispersion of magnetic particles in a nonmagnetic fluid medium. (Here the term nonmagnetic implies the relative absence of collective magnetic properties, such as ferromagnetism.) Typically, the magnetic particles will be electrically conducting, and the fluid medium will not, but this is not required. When electrically conducting magnetic particles are to be included, they may comprise electrically conducting magnetic material, or nonconducting magnetic material coated with a conducting layer, typically metallic in nature. For simplicity of discussion, the magnetic particles can be chosen to be small enough that the dispersion will not sediment during the fabrication process, but this is not required for controlled production of FSC materials.

The dispersion is then subjected to a magnetic field. This magnetic field causes particles to chain along the field direction, creating oriented aggregates of magnetic particles. If the field direction is fixed, and the sample is stationary, the rod-like structures in FIG. 1 emerge. If the field direction is fixed, and the sample is rotated, the sheet-like structures in FIG. 2 emerge. The latter structures can also be formed in a stationary sample subjected to a rotating field. It is important to note that both of these structures can produce high bulk electrical conductivity at very small particle volume fractions.

"The process of synthesizing a field-structured composite material includes varying the relative orientation of the composite and external magnetic field during the process of creating the field structured composite material. Additionally, the relative orientation of the composite material and the external magnetic field can be restricted so that the magnetic field vector remains in a single plane."

The conductivity of such oriented aggregates of magnetic particles depends on both the length of time that the magnetic field is applied and on the strength of the applied magnetic field. In the synthetic process tested, a field of several hundred Gauss was found to be more than sufficient to produce bulk conductivity.

The rate of aggregate formation can be slowed, or even reversed, by reducing the applied magnetic field, so that the magnetic particles can diffuse or sediment. For example, assume that the goal is to create a FSC material with a preselected bulk conductivity. If the evolution of aggregates accidentally proceeds too far, so that the bulk conductivity is larger than desired, an appropriate aggregate structure can be regained by reducing the applied magnetic field. The bulk conductivity can even be used as a control parameter in a feedback control FSC fabrication system. As a result, the final conductivity of such field-structured composites can be precisely controlled. This ability to precisely control the properties of the final composite is why field-structured composites enable numerous applications suggested for, but not easily realized using conventional conducting composite materials.

Any material whose structure results from the magnetic field-induced formation of aggregates in a distribution of magnetic particles in a fluid medium are field-structured composite materials. At times an FSC material which remains in the fluid state may be well-suited to an application, e.g., a shear stress sensor to measure onset of slip across a coupling between rotating members. There are, however, applications in which a solid FSC material is more appropriate. Solid field-structured composite materials can be formed by choosing a fluid medium which can be solidified without disrupting the particle aggregates existing in the dispersion. Suitable modes of solidification include freezing, gel formation, and polymerization, e.g., through the action of temperature increase or optical illumination.

A particularly useful class of field-structured composite materials are those solid FSC materials in which the non-conducting medium responds to the presence of various chemicals in the surrounding environment by alteration of volume and/or shape. Examples include instances where the solid medium containing the dispersion of magnetic particles is a polymer or gel which expands in the presence of, e.g., acetone or water. If the FSC material is near the critical volume fraction for bulk conductivity, that conductivity will undergo a large change as the medium changes shape. Such materials can be used as sensitive chemical sensors.

In a related set of applications, FSC materials can be used as the basis for mechanical stress/strain sensors. As long as the medium and the magnetic particles have different elastic properties, an applied stress or strain will change the electrical conductivity as outlined above. Strains less than $10^{-9}$ should be easily detectable in such sensors.

It is well known that the distribution of dispersed microparticles in composite materials can have dramatic effects on the strength of such materials. For example, in metals and ceramics having micron to submicron dispersed particles, the flow of dislocations which control plastic flow at high temperatures varies dramatically on the separation of such particles. A significant source of strengthening in brittle materials is the major increase in fracture energy which can be caused by the interface between that material and a distribution of particles bonded thereto. The strength, toughness, or abrasive properties of materials can be altered by introducing particulates or by changing the distribution of particulates therein. In the same manner, the strength of solid FSC materials is a function of extent of evolution of the oriented aggregate structure. The precise effect depends in well-understood ways on the bonding process between the magnetic particles and the medium, and on the mode of yielding normally exhibited by the medium.

A typical process for making FSC materials is shown schematically in FIG. 3. This flow diagram shows the steps common to one subclass of processes useful for making FSC materials. The process details are not to be considered limiting or necessary, but simply as illustrative of one such process.

The first step is to prepare the materials which will combine to form the FSC material. In this example electrically conductive magnetic particles and an electrically nonconducting fluid medium are used, but this choice is not vital to the formation of an FSC material.

The conducting magnetic particles and the fluid medium are then combined so as to form a mixture comprising a uniform dispersion of conducting magnetic particles in the fluid medium. Other materials may also be included in the mixture. Here the term uniform means that the density of conducting magnetic particles as dispersed in the fluid medium is approximately constant on all length scales and in all locations. It does not indicate a precisely constant volume fraction. Thorough mechanical mixing is found to be sufficient for this process step.

Once the above mixture is formed, a magnetic field is applied to form the desired texture in the dispersion of conducting magnetic particles. If the magnetic field is fixed in orientation relative to the incipient composite, the spatial distribution of the initially-uniform dispersion of conducting magnetic particles evolves toward an interconnecting network of conducting rod-like concentrations as shown in FIG. 1.

For the purposes of the current process this evolution can be monitored by measuring the conductivity of the mixture perpendicular to the applied magnetic field. This conductivity monitors the formation of the interconnecting network and is used as a feedback parameter to control the applied magnetic field—in this case supplied by a coil. If this conductivity is smaller than a preselected target value, the process is allowed to continue. If it is greater, the field is reduced to the point that the aggregation process reverses. Once the conductivity reaches the target value, the feedback control system maintains the desired structure while the continuous phase is solidified.

Other parameters can also be used to control the aging process. Most simply, the time spent aging the material can be controlled, although this does not provide the most precise control over the properties of the resulting FSC material. This time control technique was used to make various samples for study as described below.

Both magnetically soft and hard particles were used in these studies. The soft magnetic particles were a 3–5 $\mu$m carbonyl iron powder used to make samples with concentrations in the range of 2.0–30.0 vol. %. The magnetically hard particles were made of $SmCo_5$, and were used at a concentration of 2.5 vol. %. Finally, stainless steel fibers nominally 1.0 $\mu$m in diameter and 1 mm in length were used at a concentration of 1.55 vol. %.

The examples above, combined with known principles of magnetic interaction, demonstrate that a wide range of magnetic particle shapes are compatible with the present invention, ranging from substantially spherical in shape to shapes substantially extended or contracted along one or more axes.

These particles were suspended in an epoxy resin 828 containing a small amount of a dispersing agent. A dispersing agent alters surface tension between the resin and the magnetic particles, and thereby discourages clumping of particles. These suspensions were placed in an ultrasonic bath for 1 hr to make them more uniform, at which point an epoxy catalyst was stirred into the suspension. The suspensions were then placed in 1 cm square polystyrene cuvets and degassed in a vacuum oven at 50° C. for 10 minutes.

The samples were then ready for exposure to the magnetic field which would cause the desired oriented aggregation structure to evolve. In this process, this exposure takes place simultaneously with a slow curing of the epoxy resin.

A 150 G magnetic field was supplied by two large plate magnets oriented such that the magnetic field was vertical, to prevent the sedimentation of evolving aggregates of magnetic particles. In those samples for which a rodlike aggregate structure is desired, the sample is placed in a fixed location and orientation between the magnets. When a sheetlike aggregate structure is desired, the sample holder was rotated around an axis perpendicular to the magnetic field at a speed of 100 rpm.

The initial curing of the epoxy takes some 20 hours, during which period the sample remains exposed to the magnetic field. This gels the resin so that the particles remain essentially fixed in place, but does not fully cure the epoxy. To fully cure the epoxy, a post-curing bake, consisting of ramping the temperature from 50° C. to 100° C. over 3 hrs, and then curing at 100° C. for at least 3 more hrs, was applied. These samples were then sectioned with a diamond saw for susceptibility measurements parallel and orthogonal to the direction of the structuring field.

A subclass of field-structured composite which can exhibit unusual optical properties occurs when the magnetic particles conduct electricity freely and the nonmagnetic medium is a semiconductor. For the proper type of oriented aggregate structures, such a field-structured composite exhibits a bulk conductivity which is a strong function of the amount of light falling on it, provided that the light has energy greater than the bandgap of the semiconducting medium.

Two effects join together to produce this extreme sensitivity. First is that the weak portions of conducting paths which are nearly complete require conduction through very short distances in the semiconducting medium. When the incoming light is absorbed by the semiconducting medium, electron-hole pairs are generated, which then enable electrical conduction in the semiconductor. Because the distances that the electrons must travel in the semiconductor are so short, any significant creation of carriers can result in a large increase in bulk conductivity.

The second effect adding to the sensitivity of such composites to incident light is that the substructure improves the portion of the incident light that is absorbed by the semiconducting medium. Essentially, the light bounces back and forth between the conducting magnetic particles (highly conducting particles are generally also highly reflective) until it is absorbed by the semiconducting medium. This effect allows a thin layer of such a composite to efficiently absorb incident light, resulting in larger concentrations of photons in the semiconducting medium between the conducting particles - precisely where the carriers will be most effective in increasing the bulk conductivity of the composite.

The above descriptions of field-structured composites and processes for their synthesis are intended to illuminate the essential nature of the present invention through discussion of specific implementations, and are not intended to limit the scope of the invention.

What is claimed is:

1. A field-structured composite material, comprising a nonmagnetic medium within which is embedded an oriented aggregate structure of magnetic particles, said oriented aggregate structure comprising at least one substructure chosen from the group consisting of interconnecting networks of rodlike aggregations of magnetic particles or sheet-like aggregations of magnetic particles, wherein the magnetic particles are substantially two-dimensional in shape.

2. The material of claim 1, wherein said medium is solid.

3. The material of claim 2, wherein said medium is a polymer.

4. The material of claim 2, wherein said medium is a gel.

5. The material of claim 1, wherein the nonmagnetic medium is an electrical insulator and the magnetic particles are electrically conducting.

6. The material of claim 5, wherein the nonmagnetic medium experiences a change in volume when exposed to selected reagents.

7. The material of claim 5, wherein the bulk conductivity of the material changes in response to applied mechanical stress.

8. The material of claim 5, wherein the bulk conductivity of the material changes in response to applied mechanical strain.

9. The material of claim 5, wherein the electrically conducting magnetic particles comprise a conducting metallic coating.

10. The material of claim 1, wherein the nonmagnetic medium has the electrical properties of a semiconductor, and the magnetic particles are electrically conducting.

11. The material of claim 10, wherein the oriented aggregate structure of the magnetic particles acts to trap light incident on the material within the material.

12. The material of claim 11, wherein the bulk conductivity of the material changes in response to incident light having energy greater than the bandgap of the semiconductor nonmagnetic medium.

13. The material of claim 1, wherein the medium is solid and the oriented aggregate structure of magnetic particles alters the mechanical properties of the material relative to those of an equivalent material comprising an essentially uniform distribution of magnetic particles.

14. The material of claim 1, wherein the medium is an epoxy resin.

15. The material of claim 1, wherein the magnetic particles are substantially spherical.

16. The material of claim 1, wherein the magnetic particles are elongated along a single axis.

17. The material of claim 1, wherein the magnetic particles comprise iron.

18. The material of claim 1, wherein the magnetic particles comprise stainless steel.

19. The material of claim 1, wherein the magnetic particles comprise a magnetic rare-earth alloy.

20. The material of claim 19, wherein the magnetic rare-earth alloy is samarium cobalt.

21. A process for synthesizing a field-structured composite material, comprising:

a) forming an essentially uniform dispersion of magnetic particles within a nonmagnetic fluid medium;

b) creating, through the application of an external magnetic field an oriented aggregate structure comprised of said magnetic particles, such that said oriented aggregate structure comprises at least one substructure chose form the group consisting of interconnecting networks of rodlike aggregations of magnetic particles or sheet-like aggregations of magnetic particles, wherein the relative orientation of the composite and the external magnetic field varies during the process of creating said oriented aggregate structure.

22. The process of claim 21, further comprising solidifying the fluid medium after the oriented aggregate structure is created.

23. The process of claim 21, wherein the magnetic particles are electrically conducting and the medium is essentially nonconducting.

24. The process of claim 23, further comprising measuring the conductivity of the composite while the oriented aggregate structure is being created.

25. The process of claim 24, further comprising solidifying the fluid medium when the conductivity of the composite has a preselected value.

26. The process of claim 25, further comprising using the conductivity of the composite as a feedback parameter to control the magnitude of the external magnetic field so that the conductivity of the composite approaches and maintains a preselected value prior to solidifying the fluid medium.

27. The process of claim 21, wherein the external magnetic field has fixed orientation relative to the composite.

28. The process of claim 21, wherein the relative orientation of the composite and the external magnetic field is restricted so that the magnetic field vector remains within a single plane.

* * * * *